(12) United States Patent
Ukita et al.

(10) Patent No.: US 6,468,876 B2
(45) Date of Patent: Oct. 22, 2002

(54) SIMPLE STACK CELL CAPACITOR FORMATION

(75) Inventors: Shigenari Ukita, Plano, TX (US); Andrew A. Anderson, Allen, TX (US); Takayuki Niuya, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/925,200

(22) Filed: Aug. 9, 2001

(65) Prior Publication Data

US 2002/0001902 A1 Jan. 3, 2002

Related U.S. Application Data

(62) Division of application No. 09/237,084, filed on Jan. 25, 1999, now abandoned.
(60) Provisional application No. 60/072,786, filed on Jan. 27, 1998.

(51) Int. Cl.[7] ..................... H01L 21/20; H01L 21/8242; H01L 29/76; H01L 29/94
(52) U.S. Cl. ................. 438/396; 438/253; 257/303
(58) Field of Search ............................... 257/303–309; 438/253–255, 396–399, 665, 964

(56) References Cited

U.S. PATENT DOCUMENTS

| | | | |
|---|---|---|---|
| 5,346,844 A | 9/1994 | Cho et al. | 437/48 |
| 5,811,849 A | 9/1998 | Matsuura | 257/306 |

*Primary Examiner*—Caridad Everhart
*Assistant Examiner*—Calvin Lee
(74) *Attorney, Agent, or Firm*—Yingsheng Tung; Wade James Brady, III; Frederick J. Telecky, Jr.

(57) ABSTRACT

A structure and method for fabricating an integrate circuit crown structure for use in a DRAM cell on a substrate comprising a common source/drain region (18) disposed within a substrate (12), the common source/drain region (18) connected to a bitline (22), a gate oxide (28) disposed over the common source/drain region (18) and forming at least two wordline gates (30), at least two storage node source/drains (20) adjacent to said gates (30) and contacted by storage node contacts (38) and a storage node bowl (36), the bowl being formed within adjacent supporting layers formed over said wordline gates wherein the storage node bowl (36) is formed, and electrically isolated from, the bitline (22) without being exposed to etching agents during its formation and without forming a wine glass stem structure and a crown extending from the top of the storage node bowl (36), is disclosed.

1 Claim, 15 Drawing Sheets

SIMPLE STACK CELL CAPACITOR FORMATION

This is a divisional application of Ser. No. 09/237,084 filed Jan. 25, 1999 now abandoned which is a non-provisional application of provisional application No. 60/072,786 filed Jan. 27, 1998.

TECHNICAL FIELD OF THE INVENTION

The present invention relates in general to the field of integrated circuits, and more particularly, to the fabrication of semiconductor integrated circuit components such as a dynamic random access memory cell, and especially the cell's capacitor.

BACKGROUND OF THE INVENTION

Without limiting the scope of the invention, its background is described in connection with dynamic access random memory (DRAM) cells, as an example.

As is well known in the art of integrated circuit design, layout and fabrication, the manufacturing cost of a given integrated circuit is largely dependent upon the chip area required to implement desired functions. The chip area is defined by the geometries and sizes of the active components disposed in the wafer substrate. Active components include gate electrodes in metal-oxide semiconductors (MOS) and diffused regions such as MOS source and drain regions and bipolar emitters, collectors and base regions. These geometries and sizes are often dependent upon the photolithographic resolution available for the particular equipment used for processing the integrated circuit.

A significant problem of current techniques for the formation of integrated circuit structures as applied to very-large-scale integration (VLSI) as more and more layers are added, is that additional steps add additional complexities to the creation of circuits on the wafer surface. The resolution of small image sizes in photo-lithography becomes more difficult due to light reflection and the thinning of the photoresist during processing. In addition, the smaller patterns lead to increasing difficulties in the electrical isolation of the circuits. As the circuits shrink, the capacitor, can become larger than the underlying circuitry, and thus the determining factor in the cell size, thereby requiring the capacitors to be stacked.

As a two dimensional process used to achieve a three dimensional structure, the goal of photolithographic patterning is to establish the horizontal and vertical dimensions of the various devices and circuits used to create a pattern that meets design requirements, such as, the correct alignment of circuit patterns on the wafer surface. As line widths shrink, photolithography of patterns down to the nanometer level and smaller approach the limits of resolution of present equipment. These width lines, in the nanometer range, become increasingly more difficult to pattern because of the need to isolate the integrated circuit components.

A DRAM cell generally consists of a transistor and a capacitor. A bitline is connected to one of the transistor source/drains and a wordline to its gate, with the other source/drain being connected to the capacitor. As the density of DRAM cells on a silicon chip increases, DRAM cells having three dimensional structures, such as stacked capacitors, have been developed to meet the increased need for miniaturization. The use of stacked three dimensional structures, for example, allows the DRAM designer to maximize the capacitance of storage nodes within the limited area of the DRAM cell.

SUMMARY OF THE INVENTION

What is needed is a structure and method for using current integrated circuit processing techniques and manufacturing equipment that meet the demands of VLSI integrated circuits. One particular area in need of improvement is the fabrication of capacitors, and more particularly stack or crown capacitors, e.g., stack capacitors used in DRAM cells. As the circuits shrink, the capacitor can become larger than the underlying circuitry, and thus the determining factor in the cell size, thus the need for stack capacitors. The capacitor and cell designs must conform to current equipment and manufacturing techniques, and at the same time, provide the required increase in chip capacity and reliability.

Unlike flatplate capacitors of the prior art, crown capacitors are three-dimensional and it is recognized herein that in the past, during some stage of fabrication, some of the partially constructed capacitors could be subjected to underetching due, e.g., to inherent variations in etching across the wafer which can remove part of the support of those capacitors and thus subject those partially constructed capacitors to damage during subsequent processing. Our recognition of this problem has led us to the process modification described herein, which significantly improves the support of the partially fabricated capacitor and significantly improves circuit yields.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

Figure 1:
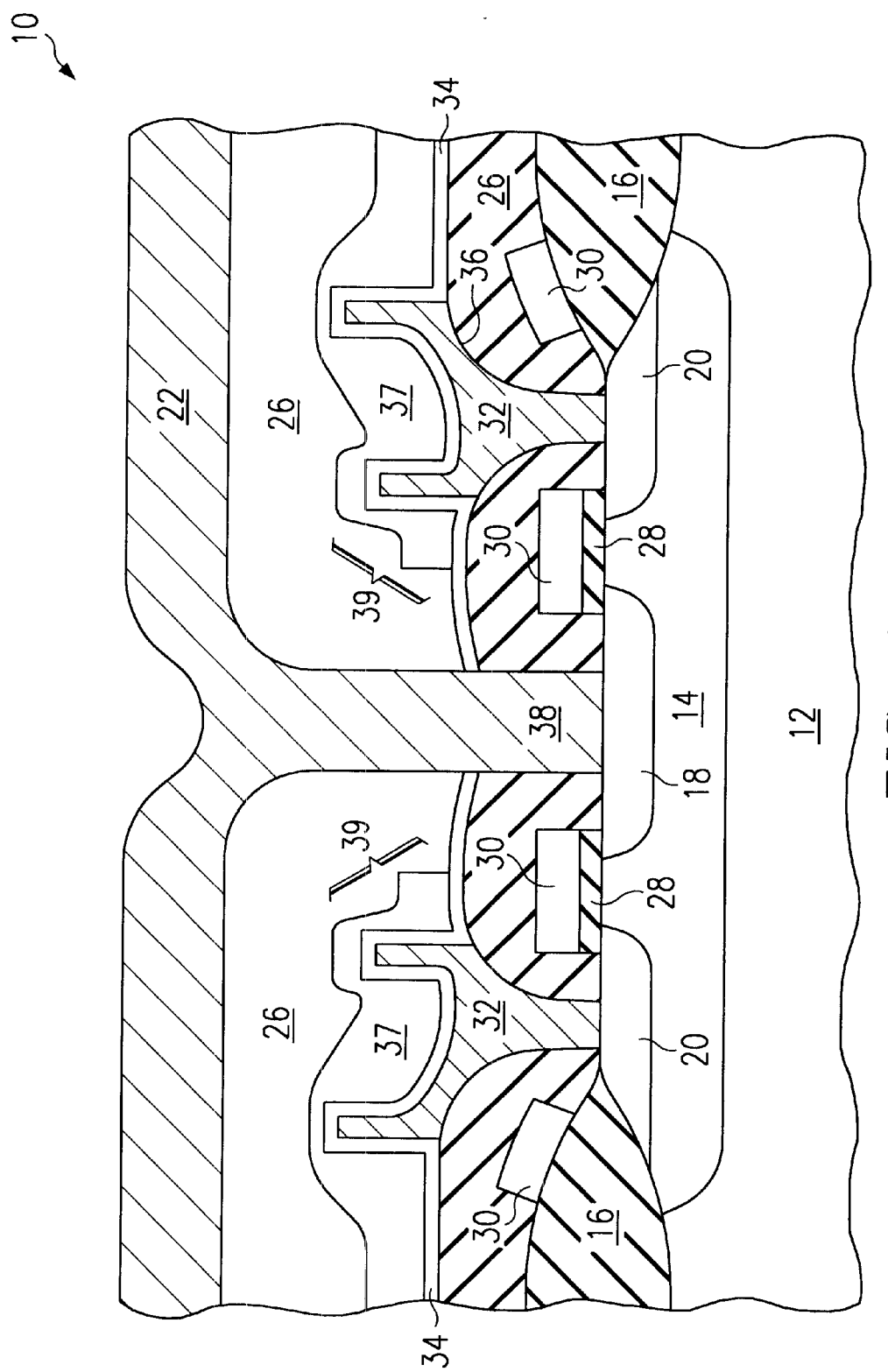
FIG. 1 is a simplified cross-sectional view of a DRAM cell.

The general features of a fully assembled pair of DRAM cells generally designated as 10 shown as a simplified cross-sectional view in FIG. 1. DRAM cells 10 have a substrate 12 that is formed having a conductivity type which is one of either a P-type conductivity or a N-type conductivity, if the substrate 12 is silicon based. Substrate 12 may be made of silicon, gallium arsenide, silicon on insulator (SOI) structures, epitaxial formations, germanium, germanium silicon, polysilicon, amorphous silicon, and/or like substrate, semi-conductive or conductive. The substrate 12 is typically made of single crystal silicon, and is usually lightly doped with boron, phosphorous or arsenic atoms.

A moat 14 is shown disposed between two field oxide regions 16 which have been grown from substrate 12. The moat region 14, generally formed by diffusion, has disposed therein storage source regions 20. The common drain 18 (common to both cells), located within moat 14, is connected to the bitline 22 bitline through the bitline contact 38 that is etched through an insulating layer 26.

Disposed adjacent to the storage source regions 20, and the common drain 18, are gate oxide 28 and wordlines 30. Portions of the wordlines 30 also function as gates, which define the field effect transistors (FET) of the DRAM cells 10. The storage nodes 36 (which form one of the capacitor plates) of the DRAM cells 10 are electrically connected to the storage source regions 20 by storage node contacts 32. A storage node 36, a dielectric layer 34 disposed over the storage node 36 and grounded upper plate 37 form the capacitor. The various components of the DRAM cell 10 are electrically isolated by insulating layers 26.

The storage nodes 36 and the storage node contacts 32 together have a generally "wine glass" shape, with an upper "bowl" and a "stem" below (the storage node contact 32 generally makes up the steam). As will be seen below, a nitride layer used herein will provide a seal around the perimeter of the bowl and will generally prevent possible underetching which would weaken the bowl during fabrication.

Figure 2:
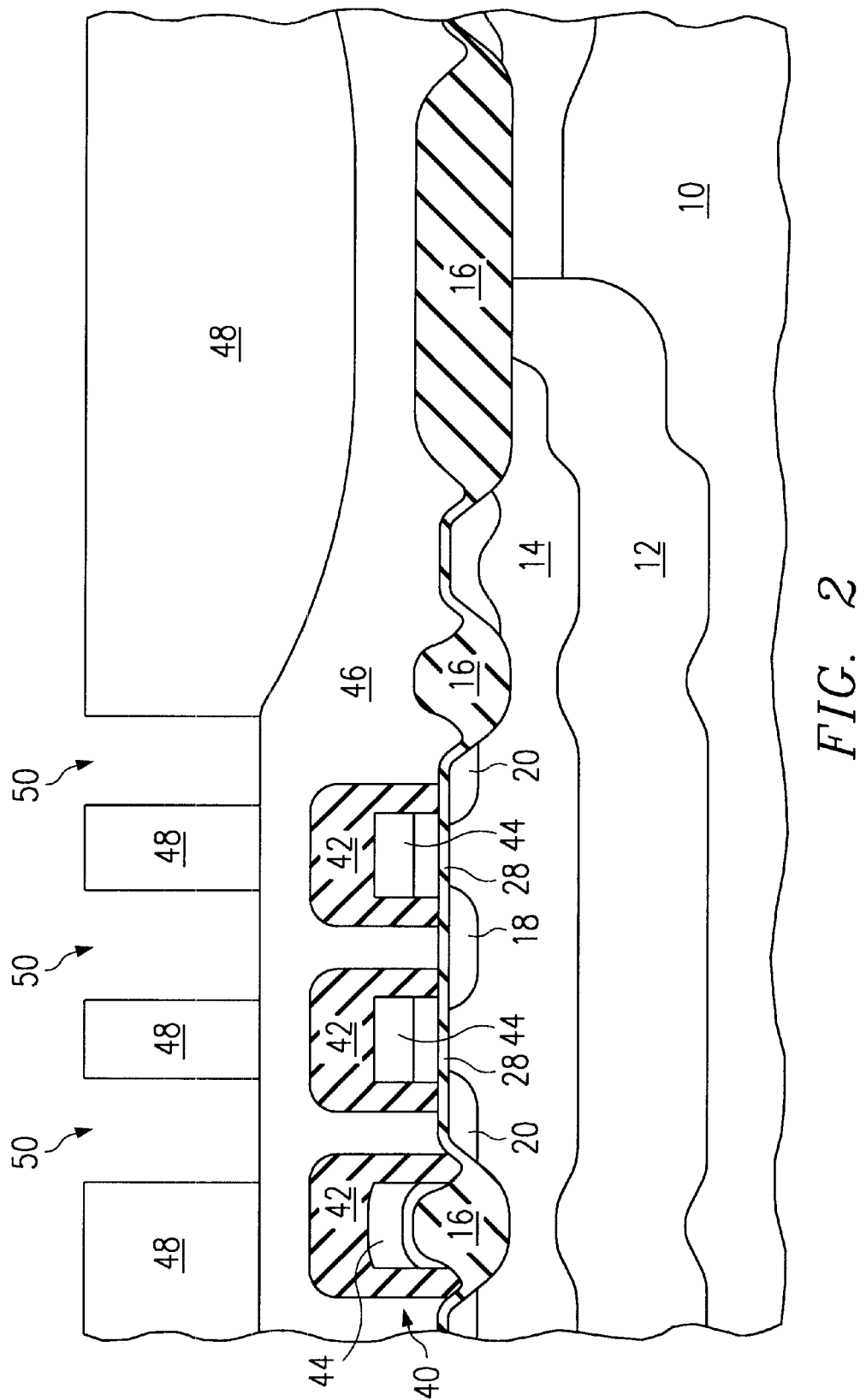
FIGS. 2 through 15 show the layers and structures formed to create a crown capacitor.

FIG. 2 depicts the first steps in the formation of the crown capacitor formation of the present invention. Three gate/wordline stacks 42 are shown composed of nitride caps 42, silicide layers 44, and polysilicon wordline/gates 30, disposed over gate oxides 28. The left "gate/wordline" stack 42 is not a gate, but leads to gates in adjacent cells. Note that FIGS. 2 through 15 show cells at the edge of a matrix and that "non-edge" cells would have an additional gate/wordline stack to the right on the three stacks 42 shown. As in FIG. 1, a moat 14 is disposed between two field oxide regions 16 which have been grown from substrate 12. The moat region 14 has disposed therein storage source/drain regions 20. The common drain 18 (common to both cells) is located within moat 14.

Disposed over the gate stacks 40 is a glass layer 46, which can be, e.g., a boro-, phosphor- or borophospho-silicate glass that has been deposited over the gate stacks 40. A photoresist has been deposited and patterned with openings 50 over the positions where the bitline and storage node contacts are to be etched.

Figure 3:
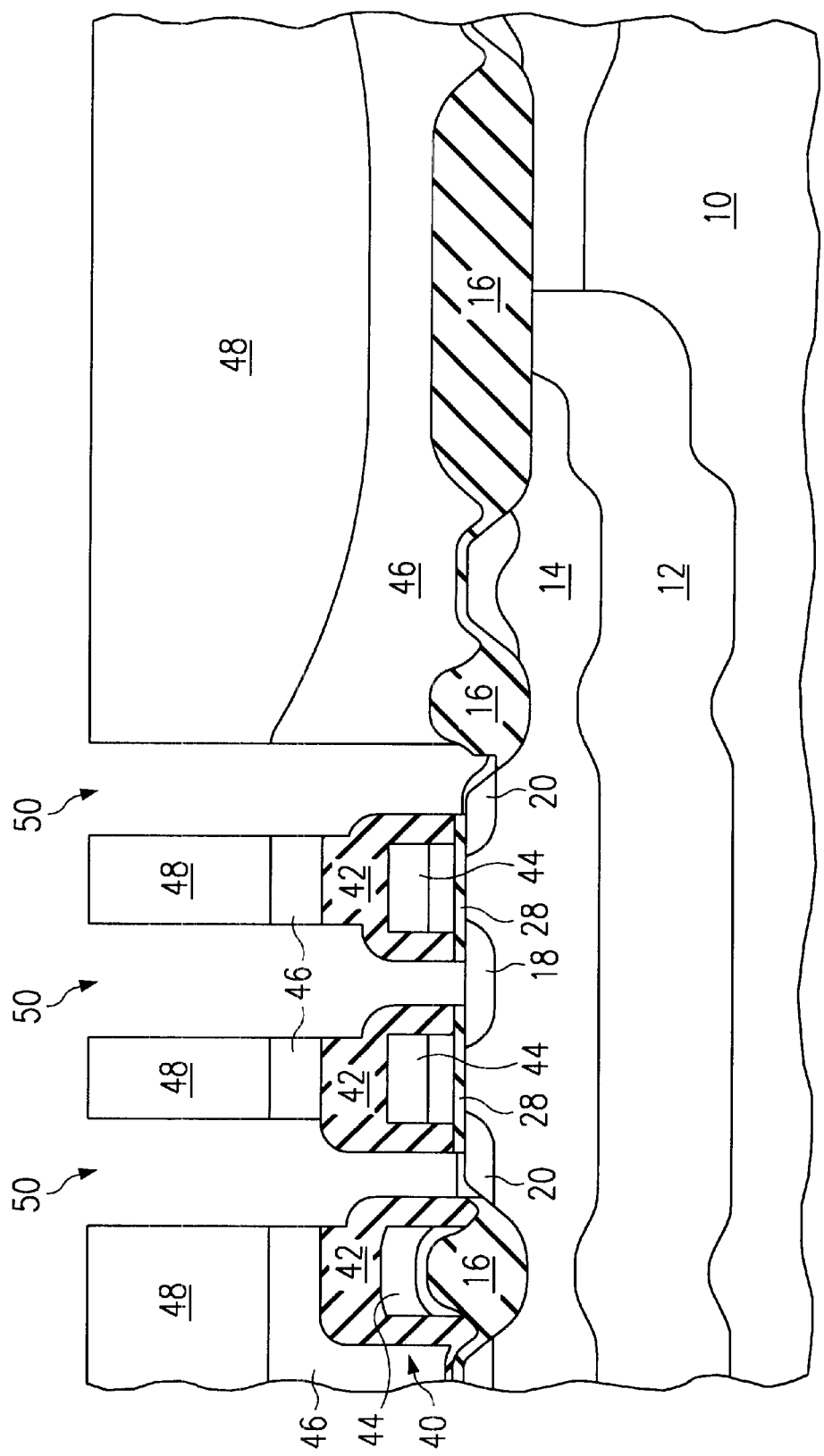

In FIG. 3, the sacrificial glass layer 46 is etched through to expose the storage source/drain regions 20 and the common source/drain 18 in a single etching step. This has the advantage of the use of a single patterning and etching step for the formation of the bitline and storage node contacts. A single patterning and a single etching step reduce the problems associated with misalignment of the mask patterns on the surface of the wafer 10 during the stepping operation. A single mask also allows for finer resolution between patterned components, for example, distance tolerances between the storage node contacts and the bitline. Also, the silicon nitride cap 42 helps direct etching into the conductive source/drain regions 20 and the common source/drain 18 while at the same time maintaining the isolation of the gates, thus making alignment less critical and improving yield.

Figure 4:
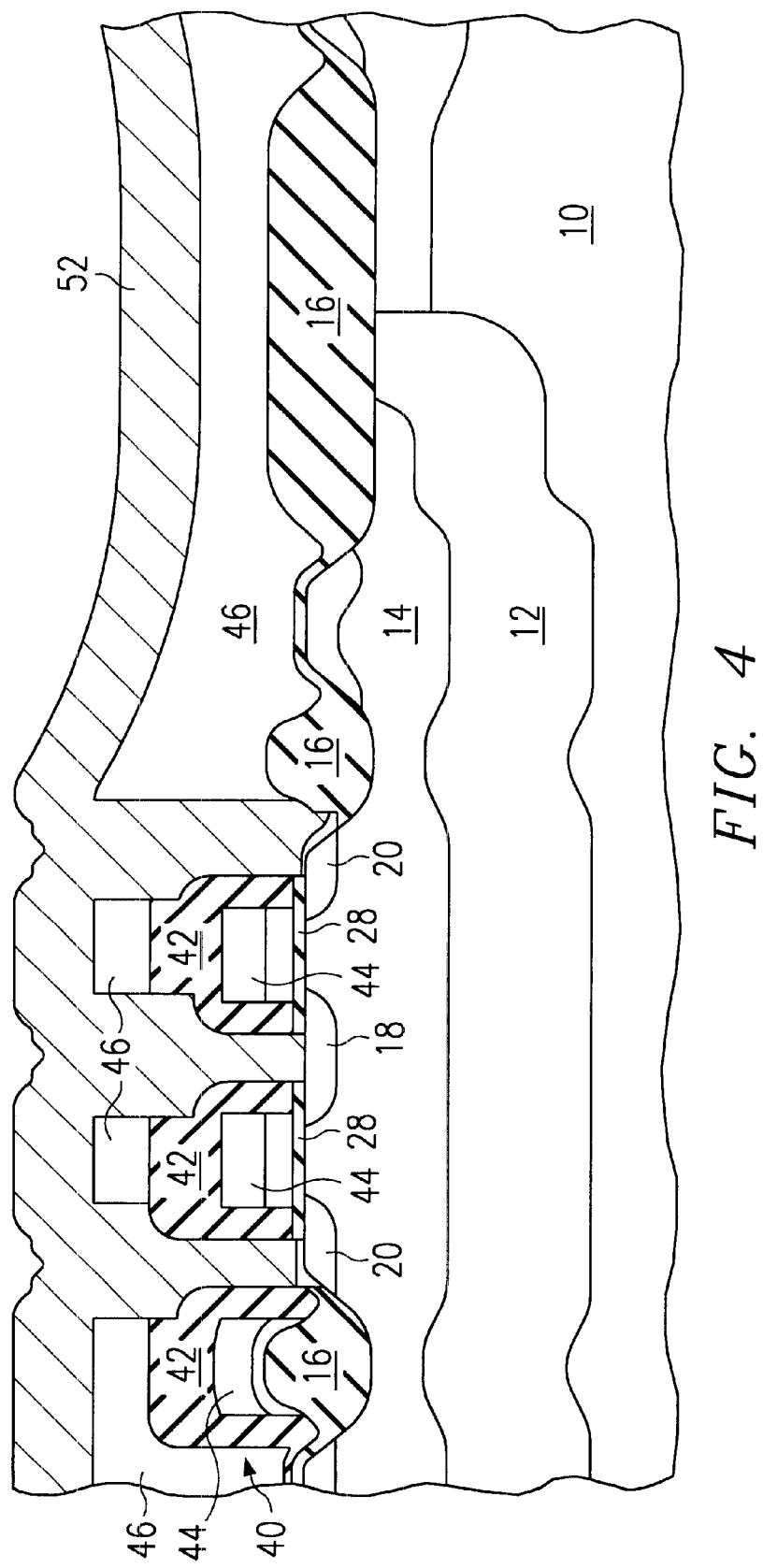

In FIG. 4, polysilicon 52 is deposited over the entire wafer 10 surface and fills the openings 50 created during the patterning and etching of the storage node and bitline contacts. In one embodiment, polysilicon 52 is made of two layers, a first doped polysilicon layer of, e.g., 500 angstroms is deposited before a subsequent deposition of undoped polysilicon. The undoped polysilicon layer can have a thickness of, e.g., 5000 angstroms. One advantage of depositing two polysilicon layers, one being doped and one undoped, is that the doped polysilicon layer will help in the formation of the contact with the conductive source regions 20 and the common drain 18. Another advantage of depositing an undoped polysilicon layer is the more rapid deposition of an undoped polysilicon, thereby reducing processing time and cost.

Figure 5:
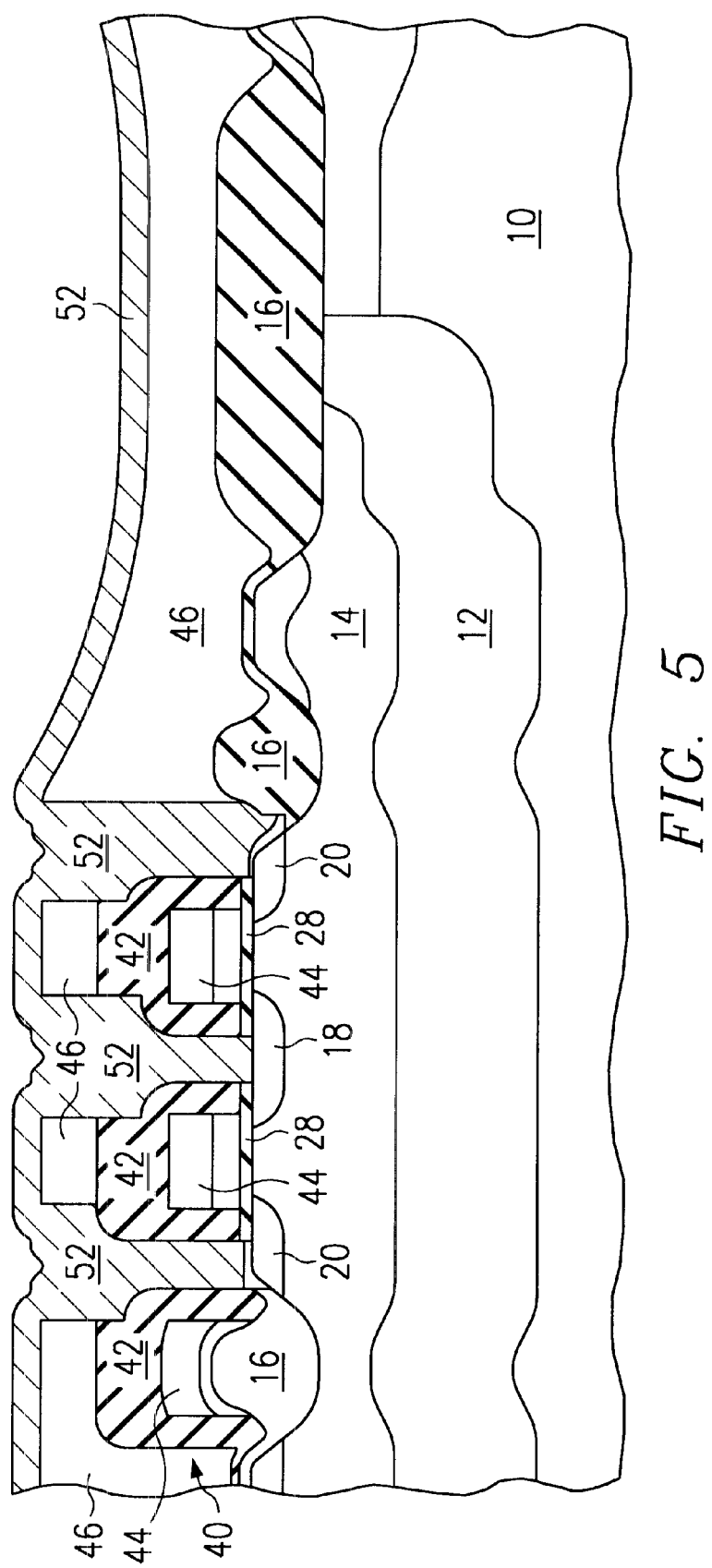
Figure 6:
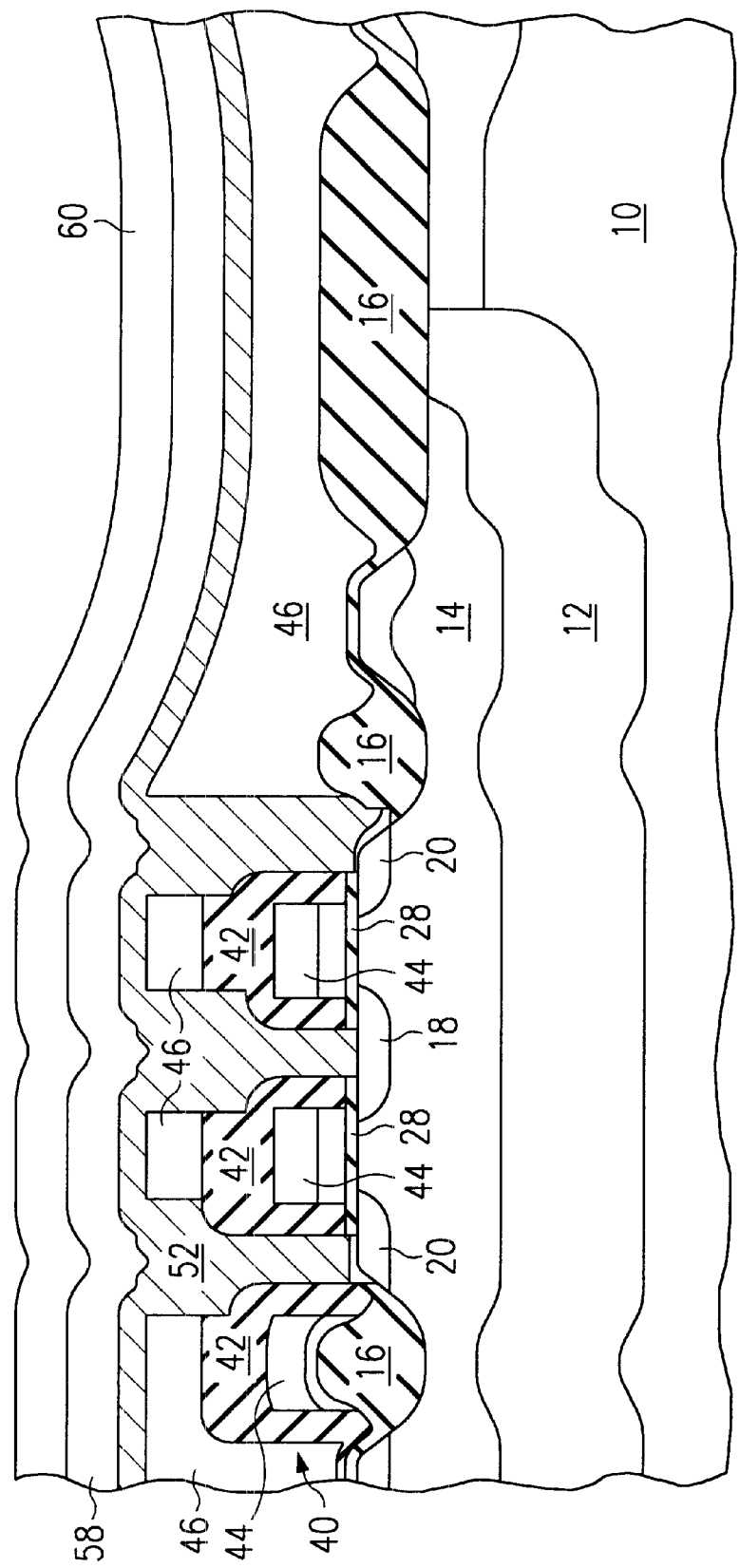

In FIG. 5 the top of the polysilicon layer 52 is etched back to a thickness of, e.g., 300 angstroms. Next, a silicide layer 58 is formed over the polysilicon layer 52. The silicides can be, for example, titanium, tungsten, cobalt or nickel and may be used to dope the poly 52 with either a p or an n dopant. In one embodiment, the silicide is a tungsten silicide that can have, e.g., a thickness of about 1200 angstroms. Following the deposition of the silicide layer 58, a first cap oxide layer 60, which can be deposited using, e.g., chemical vapor deposition (CVD) or plasma enhanced chemical vapor deposition (PECVD) of an oxysilane, such as, tetraethyl oxysilane. The thickness of the first cap oxide layer 60 can be, e.g., 2000 angstroms.

Figure 7:
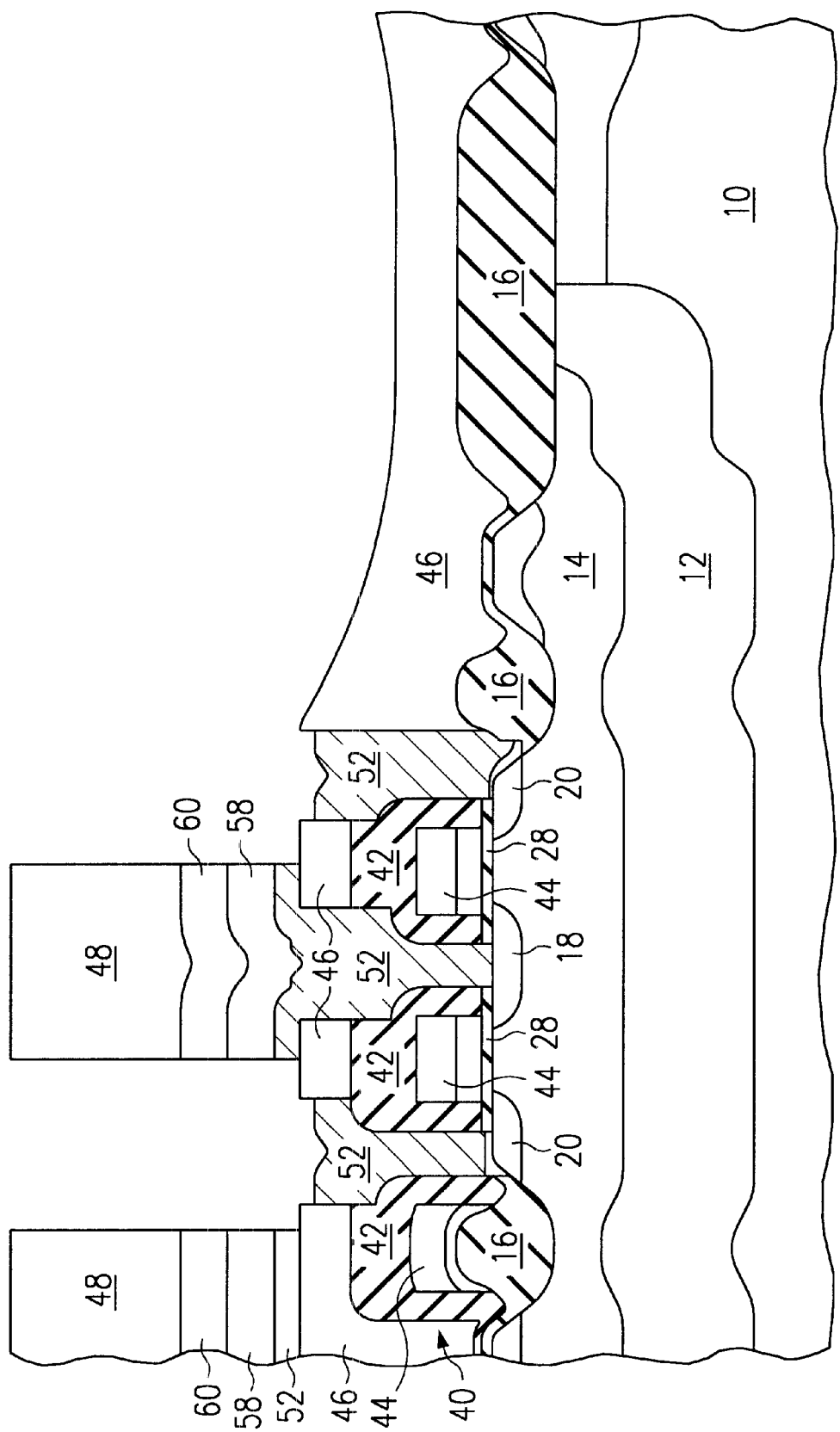
Figure 8:
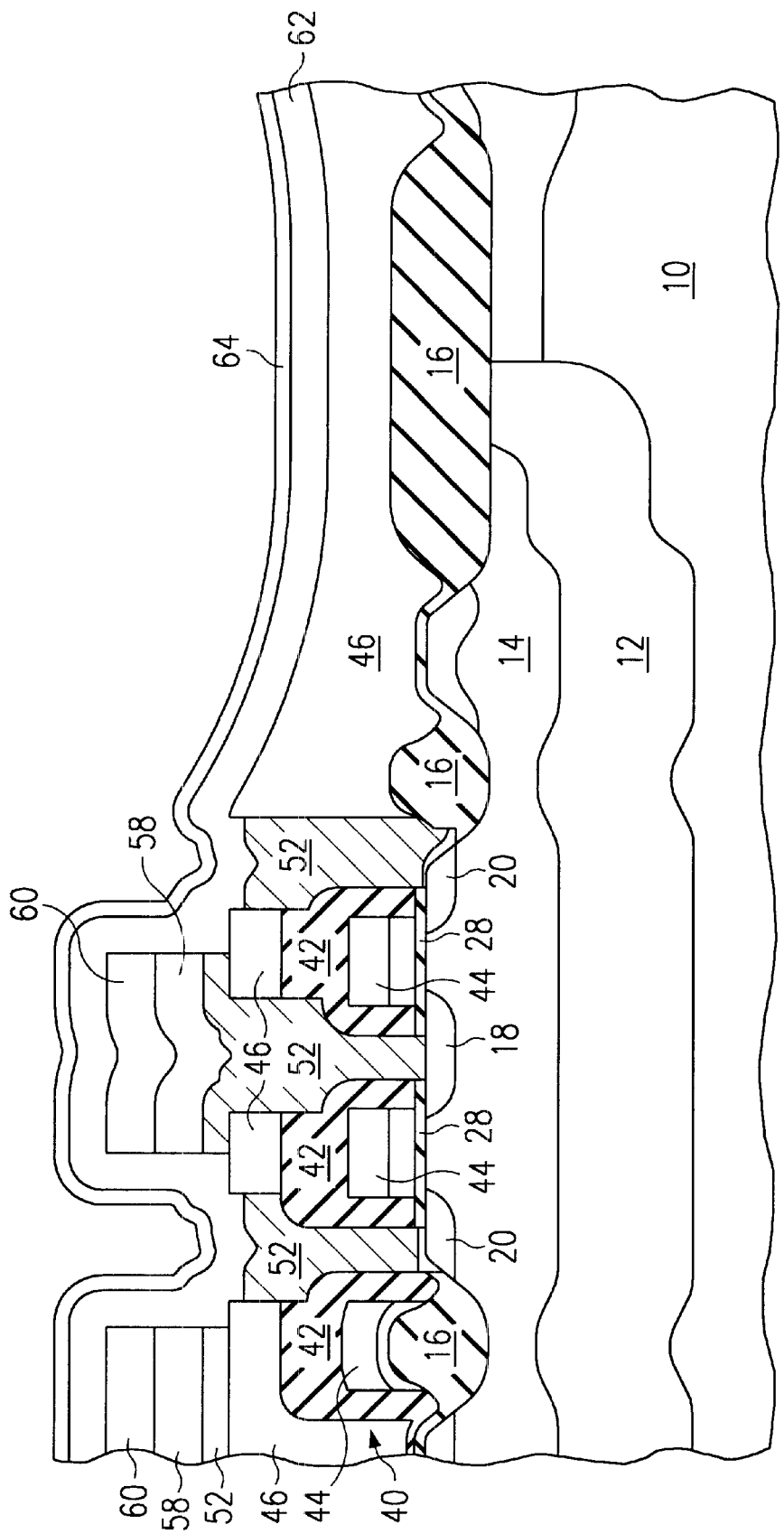

FIG. 7 shows the structure that is formed following the deposition and patterning of first photoresist 48 pattern and etchback that will lead to the isolation of the bitline and the bitline contact from the storage node contacts. The etchback can be accomplished in two steps, first an oxide etchback followed by a silicide-polysilicon etchback. The etchback can be, e.g., a 1500 angstrom etchback that exposes the top surface of the glass layer 46. The etchback can also etch into the polysilicon layer 52 that was deposited to form the storage node contacts 32.

Figure 9:
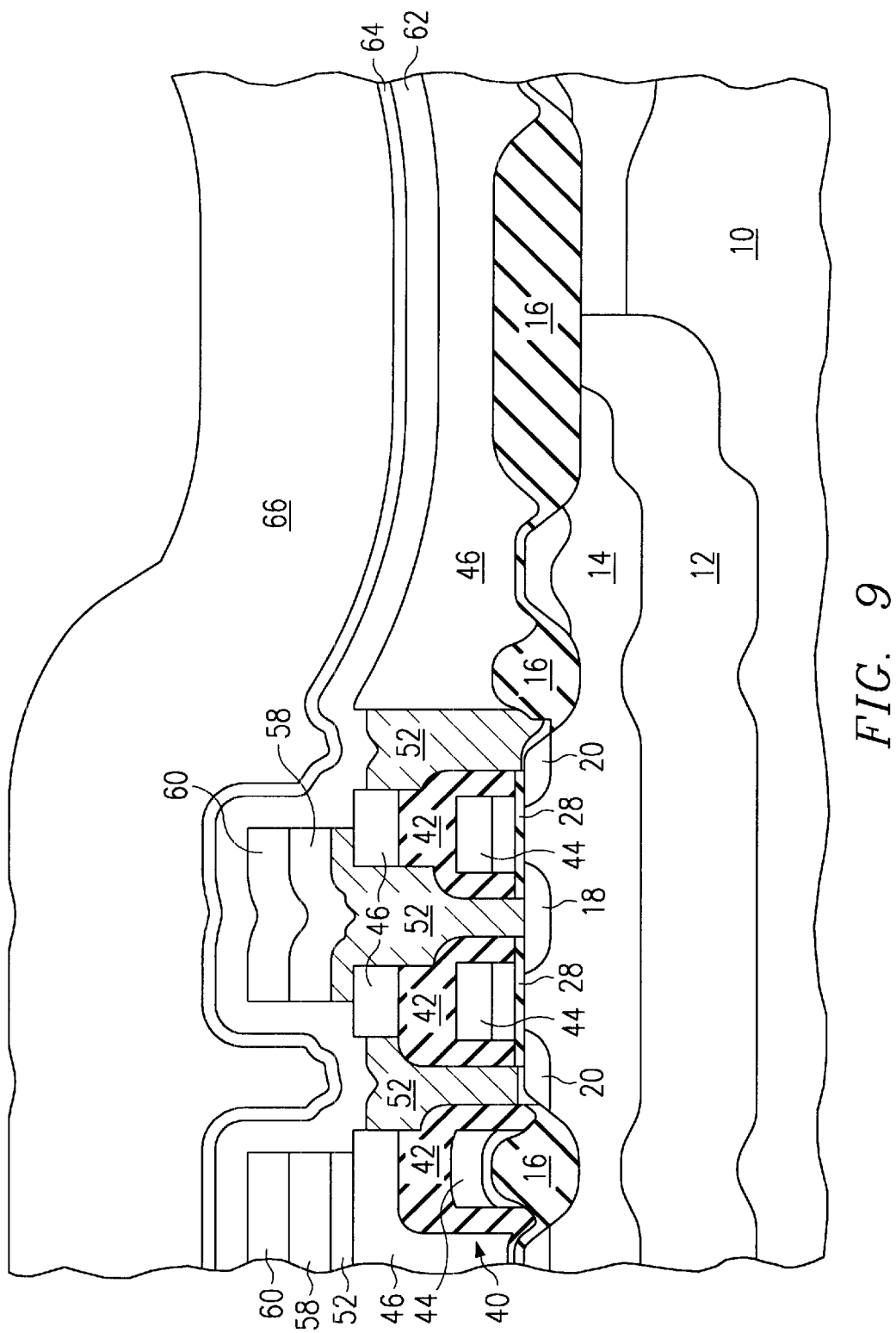

Following the etchback step depicted in FIG. 7, after removal of the first photoresist 48 a second cap oxide layer 62 is conformally deposited over the entire wafer 10 surface. The second cap oxide layer 62 completes the isolation of the bitline 22 from the storage node contacts 32. The second cap oxide layer 62 can also be deposited using CVD or PECVD, and can have, e.g., a thickness of 500 angstroms. Next, a stopper silicon nitride layer 64 of, e.g., 500 angstroms, is deposited over second cap oxide 62. As will become apparent in later figures, the stopper nitride layer 64 will both be used during a subsequent two-step etching and will seal to the perimeter of the bowl (of the wineglass shaped storage node) and generally prevent underetching of the lower portion of the bowl during removal of the dummy oxide. Following the depositions of the second cap oxide layer 62 and the nitride layer 64, a dummy oxide 66 is deposited over the entire wafer 10. The deposition of the dummy oxide 66 is depicted in FIG. 9. The dummy oxide 66 can have a thickness of, e.g., 5000 angstroms.

Figure 10:
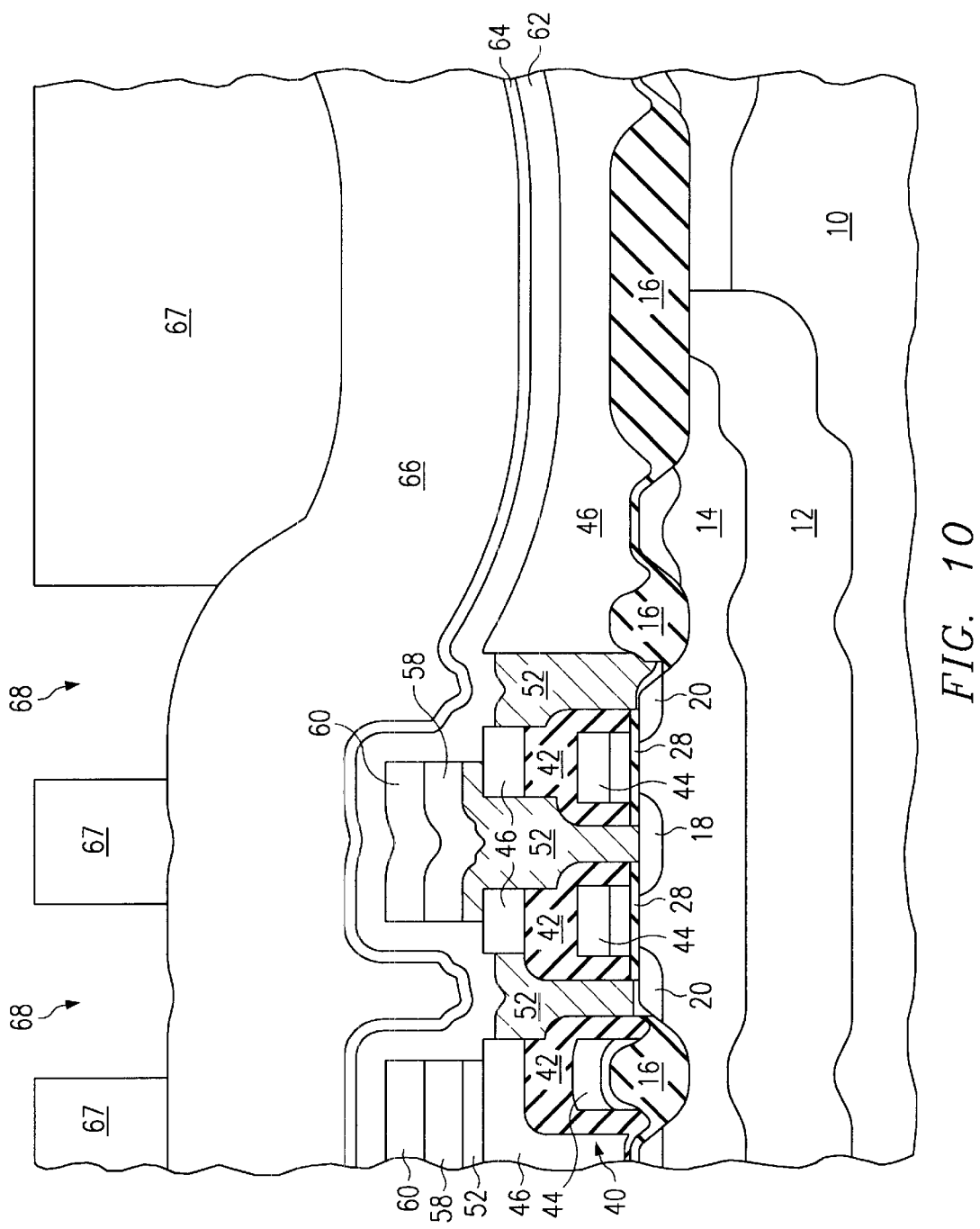
Figure 11:
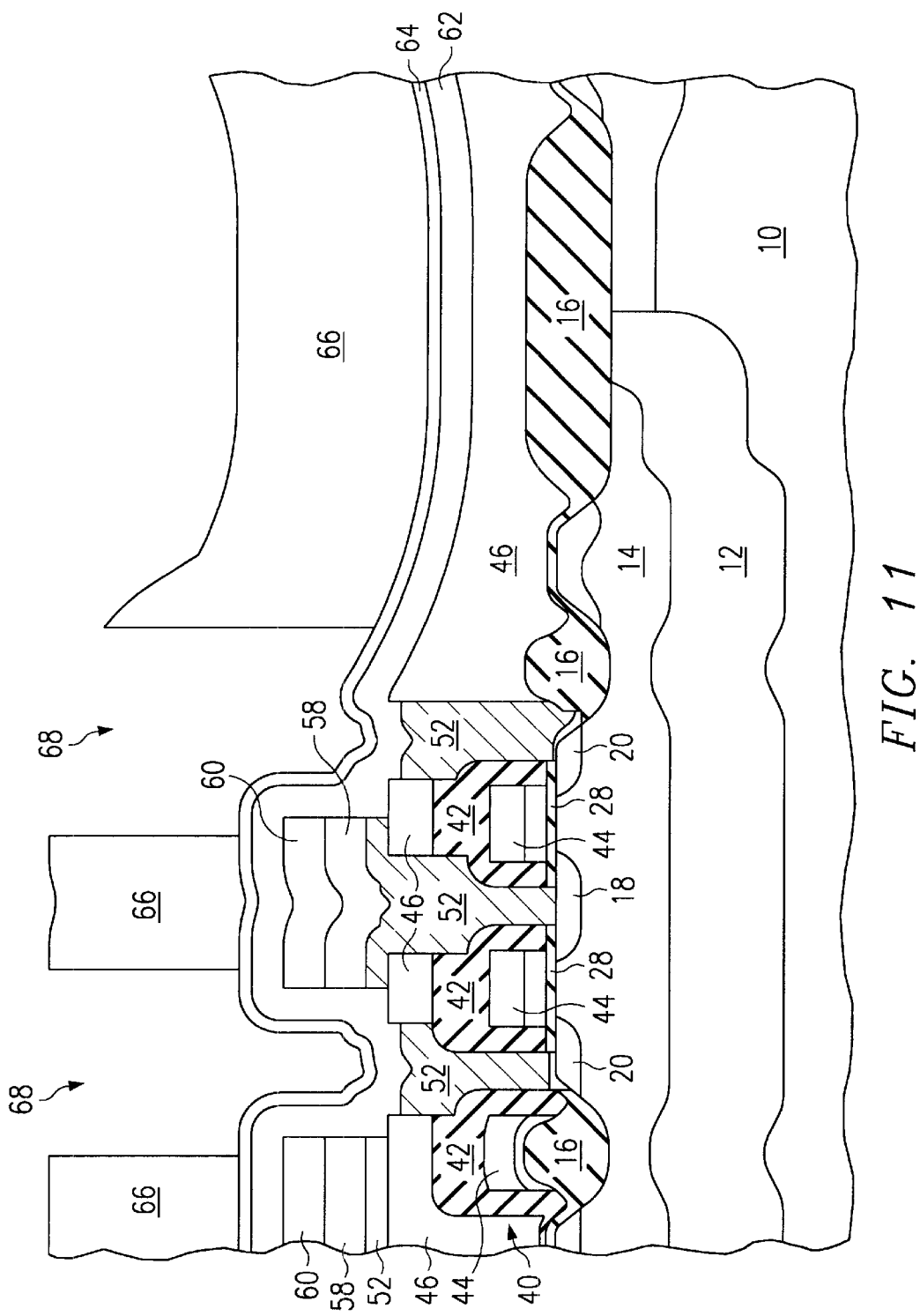

FIG. 10 shows the pattern for a second photoresist 67 that will lead to the formation of the bowl on crown structures for the storage nodes or capacitors. Vias 68 are etched through to the stopper nitride layer 64.

Figure 12:
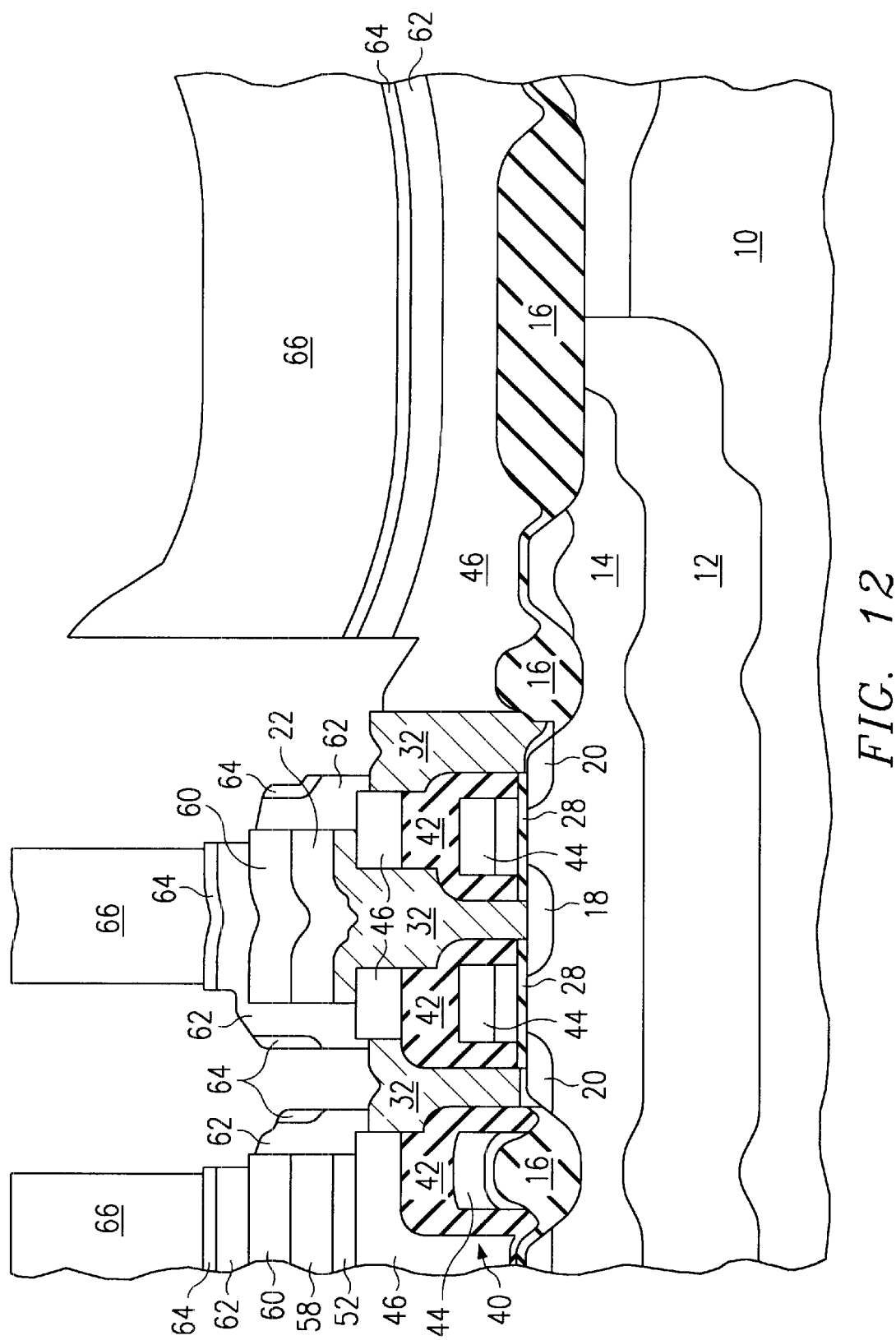

FIG. 12 shows some important features of the present invention as relate to the build-up of layers in the previous figures and the etching step depicted in this figure. Both the stopper nitride layer 64 and the second cap oxide 62 are etched through via 68 to form the lower portion of the structure that will be part of the capacitor. This is a timed etch, which will etch the second cap oxide 62, but will not etch through the combined thickness of second cap oxide 62 and first cap oxide 60 and thus will not open to (and cause a short to) bitline silicide 58. The bowl lower portion, as will be formed in subsequent steps, will make contact with the storage node contact 32, but importantly, will be formed below the surface of the stopper nitride layer 64 and the second cap oxide 62. By forming the lower portion of the bowl structure below the stopper nitride layer 64 and the second cap oxide 62 the present invention generally eliminates the formation of vulnerable floating wine glass bowls. The structure disclosed herein prevents the formation of vulnerable floating wine glass type structures which float during a portion of the fabrication process by protecting the lower portion of the bowl from subsequent wet etching steps that, in the prior art, lead to floating bowl defects.

The structure disclosed herein also eliminates an entire series of build-up and etching steps that were necessary to extend the length of the storage node contacts in order to isolate them from the bitline 22. Isolation is accomplished by depositing a first cap oxide layer 60 and a second cap oxide layer 62. Because the first cap oxide layer 60 is built-up over the bitline 22 but removed from over the storage node contact 32 during the etching step depicted in FIG. 12, the combined first and second cap oxide layers 60, 62 increases the oxide depth over the silicide 58 (which allows etching to expose the storage node contact 32 without exposing the bitline silicide 58). The extra distance provided by first cap oxide layer 60, thus maintains the electrical isolation of silicide 58 (which is the top of the bitline 22) while allowing exposure of the top surface of the storage node contact 32. This allows fabrication of a crown base which, unlike the prior art, is already isolated and thus does not require underetching during later steps of fabrication.

Figure 13:
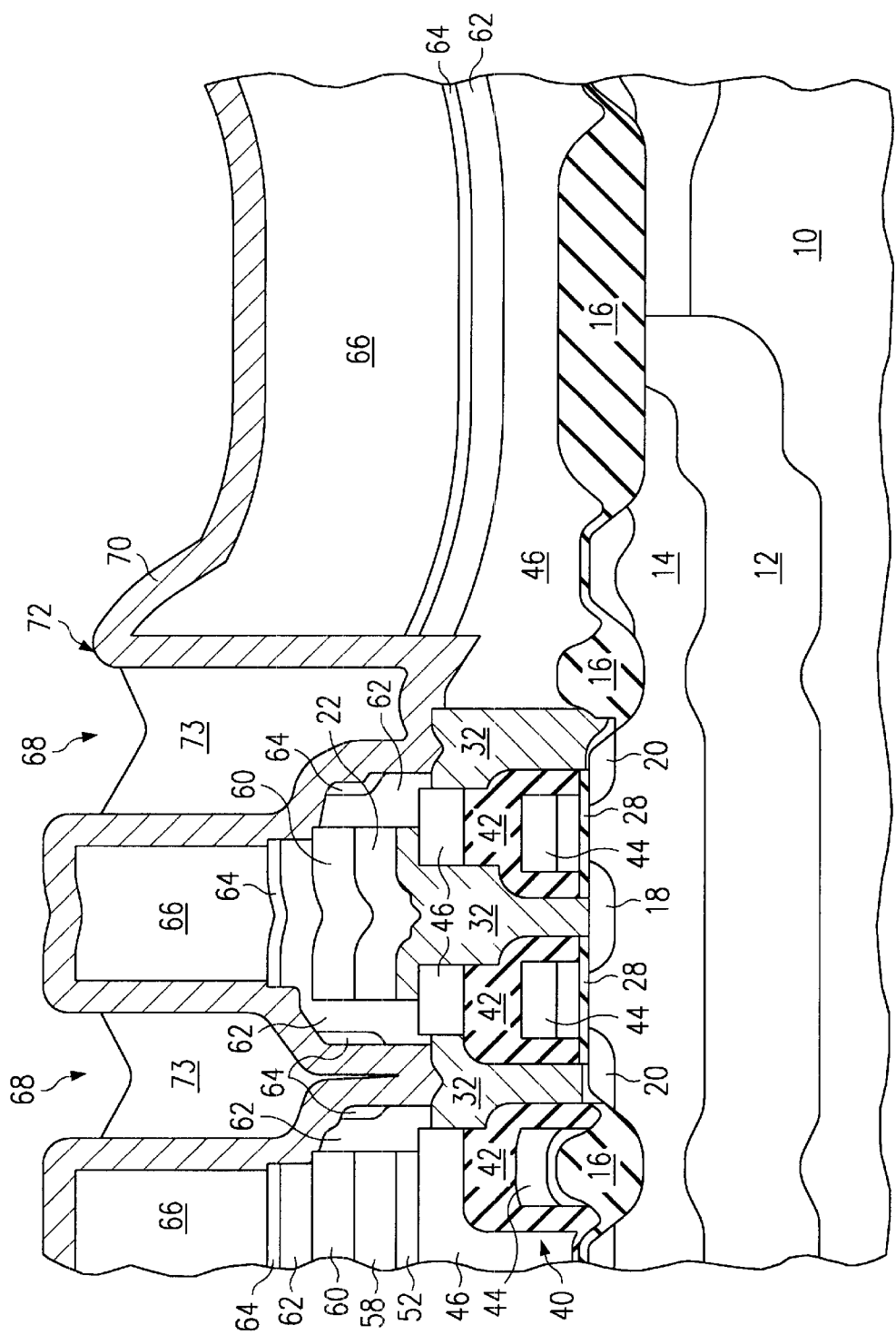

In FIG. 13 a crown polysilicon 70 is conformally deposited over the wafer 10 and partially fills the opening 68 formed in the figures described hereinabove. To reduce the reflectivity of the crown polysilicon 70, a non-reflective layer 72 is deposited over the crown polysilicon 70. The crown polysilicon 70 can have a thickness of, e.g., 500 angstroms. The non-reflective layer 72, also known as a bottom anti-reflective coating (BARC), can be any inorganic material that reduced the reflection of the stepper UV light source during subsequent patterning steps. Into the openings 68, and over the non-reflective layer 72 and the crown polysilicon 70 is deposited and patterned a third photoresist 73. The third photoresist 73 can be, for example, a positive tone photoresist. After a blanket exposure, the developer removes the photoresist from the entire wafer surface except for the resist at the bottom of the crown polysilicon 70.

Alternatively, the process can be modified by the application of thermally cured spin on glass, such as HSQ available from DuPont, after the crown polysilicon 70 layer is deposited. A blanket oxide may be applied resulting in the thermally cured spin on glass being disposed in the stem of the crown polysilicon 70. The thermally cured spin on glass is then used to protect the stem of the crown polysilicon 70 during subsequent etches and is removed using either a wet or a dry etch after the completed crown is formed.

Figure 14:
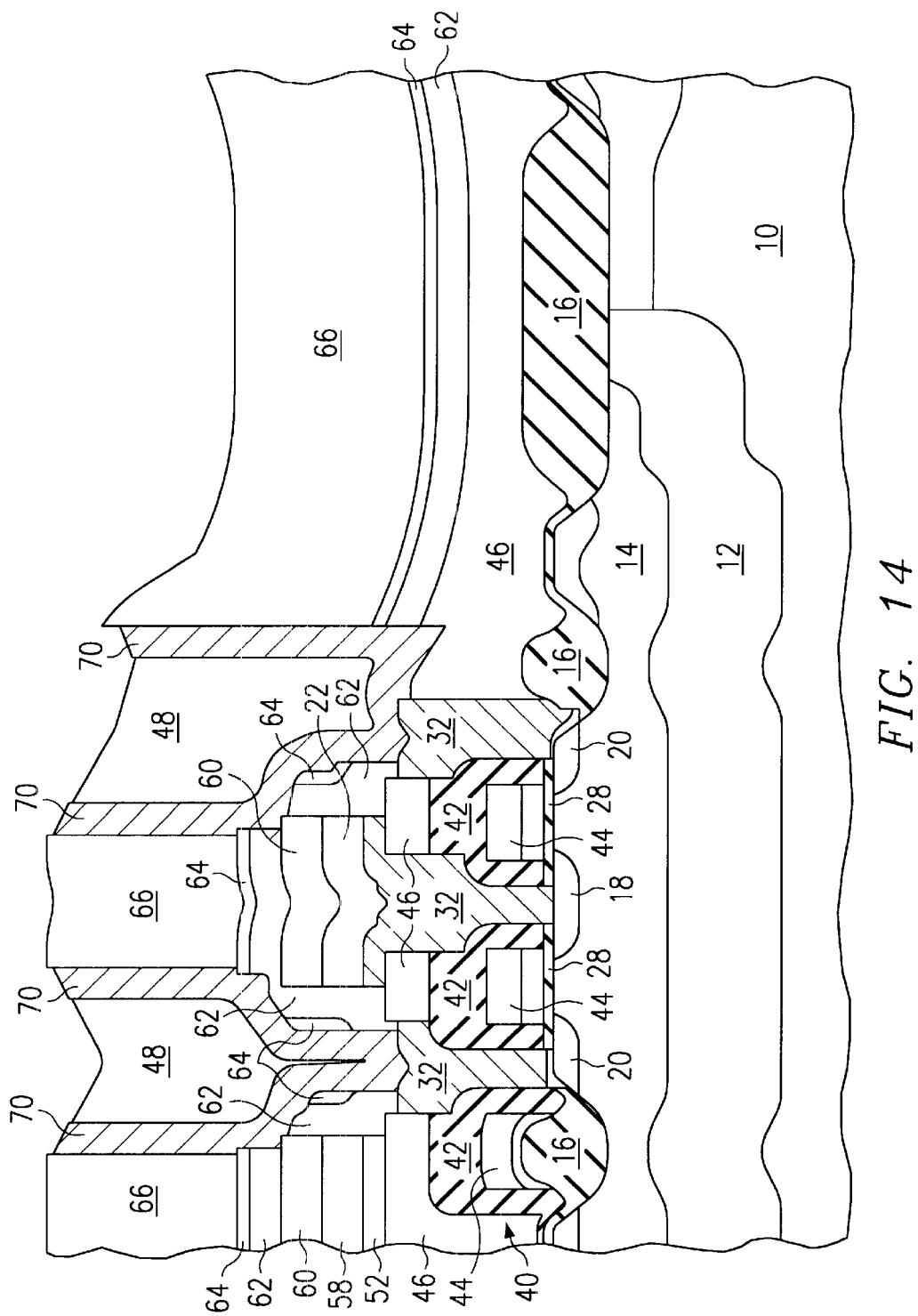

FIG. 14 depicts the structure following an etchback step in which the non-reflective layer 72 is removed along with the top surface of the crown polysilicon 70 as depicted in FIG. 14. Next, the photoresist 73 is ashed and cleaned, and, following the removal of the photoresist, the dummy oxide 66 is wet stripped using, e.g., a piranha etch. Piranha etching and photoresist ashing and clean-up are well known to those of skill in the art.

Figure 15:
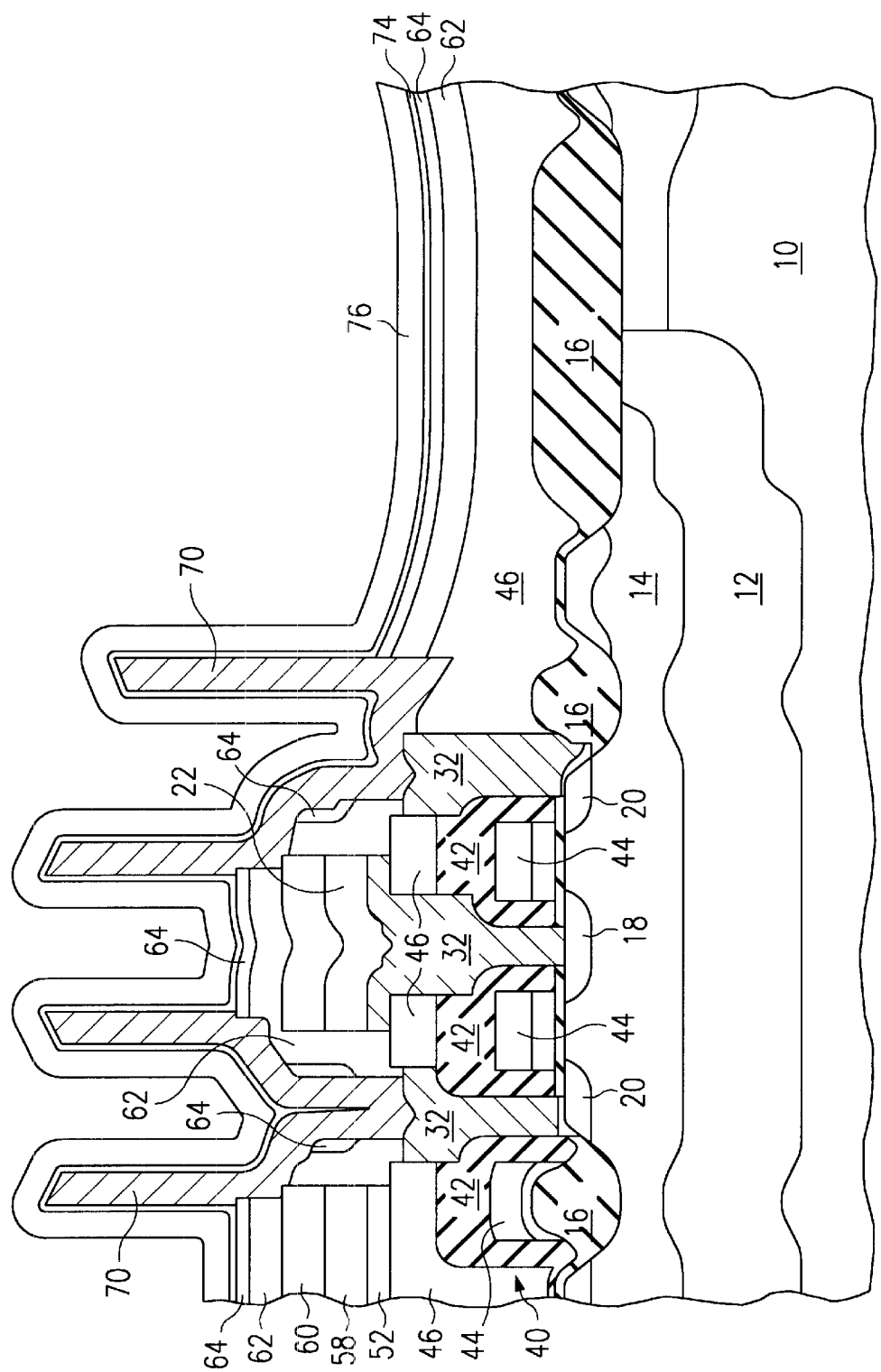

The removal of the photoresist 73 and the dummy oxide 66, leaves the top of the bowl extending above the stopper nitride layer 64, as depicted in FIG. 15. The entire bottom of the polysilicon storage node bowl 70 is below the stopper nitride layer 64. Next, a dielectric nitride layer 74 is blanket deposited over the wafer 10 by, for example, a low pressure CVD (LPCVD). The dielectric nitride layer 74 is then preferably converted into an oxynitride film by oxidizing the dielectric nitride layer 74. The completion of formation of the crown capacitor follows conventional steps known to those in the art, such as isolation of the crown capacitor plate and formation of the grounded upper plate 76, same as the upper plate 37 depicted in FIG. 1. Thus, the bowl of capacitor storage node generally has a lower portion protected from the dummy oxide etch by its outer perimeter (the inside of the bowl being polysilicon is not significantly attacked by the dummy oxide etch).

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating a polysilicon storage node structure of an integrated circuit crown capacitor with the storage node having a stem connected to a storage node contact and a cup, with said cup having a bottom and an oval wall top, said method comprising:

forming a storage node contact and forming a bitline cap oxide layer;

forming a nitride layer over said storage node contact and said bitline cap oxide layer;

forming a dummy oxide over said nitride layer;

forming a cup opening by etching through said dummy oxide layer and said nitride layer and by at least partially etching through said cap oxide layer;

depositing polysilicon to form a cup bottom and oval wall top; and etching said dummy oxide;

wherein said cap oxide has a first portion and a second portion (with both said portions being over said bitline, but with only one portion being over said storage node contact) wherein said first portion is formed and patterned to provide an opening to said storage node contact and wherein said second portion of said cap oxide layer is only formed over said storage node contact, and wherein said at least partial etching of said cap oxide layer etched through exposed parts of said second portion and into but not through said first portion of said cap oxide; and wherein said nitride layer is in direct contact with said polysilicon wall and said crown, said stem is not exposed to etching agents.

* * * * *